United States Patent [19]
Shiffer, II

[11] Patent Number: 5,343,058
[45] Date of Patent: Aug. 30, 1994

[54] GATE ARRAY BASES WITH FLEXIBLE ROUTING

[75] Inventor: James D. Shiffer, II, Fremont, Calif.
[73] Assignee: VLSI Technology, Inc., San Jose, Calif.
[21] Appl. No.: 902,183
[22] Filed: Jun. 22, 1992

Related U.S. Application Data

[63] Continuation-in-part of Ser. No. 793,917, Nov. 18, 1991.

[51] Int. Cl.⁵ .................. H01L 27/10; H01L 23/48
[52] U.S. Cl. ......................... 257/204; 257/207; 257/211
[58] Field of Search .................. 257/204, 207, 211

[56] References Cited

U.S. PATENT DOCUMENTS 4,884,118 11/1989 Hui et al. .................. 257/207
4,989,062 1/1991 Takahashi et al. .......... 257/211

*Primary Examiner*—Robert Limanek
*Attorney, Agent, or Firm*—Burns, Doane, Swecker & Mathis

[57] ABSTRACT

A transparent power grid is formed using a first metal layer and a second metal layer in a gate array having defined therein well tie-down regions. The first metal layer includes first power supply busses for supplying operating and reference voltages to the transistors, the first power supply busses extending in a row direction and overlapping the well tie-down region. The second metal layer includes second power supply busses for supplying operating and reference voltages to the transistors, the second power supply busses extending in a column direction and overlapping the well tie-down regions and the first power supply busses. Vias are formed where first and second power supply busses each supplying a same one of the operating voltage and the reference voltage overlap, thereby connecting the first and second power supply busses. Contacts are formed where first and second power supply busses each supplying a different one of the operating voltage and the reference voltage overlap, the contacts connecting the first power supply busses to underlying well tie-down regions. In effect, all of the necessary vias and contacts are placed in locations that in the prior art were all occupied by contacts alone.

7 Claims, 7 Drawing Sheets

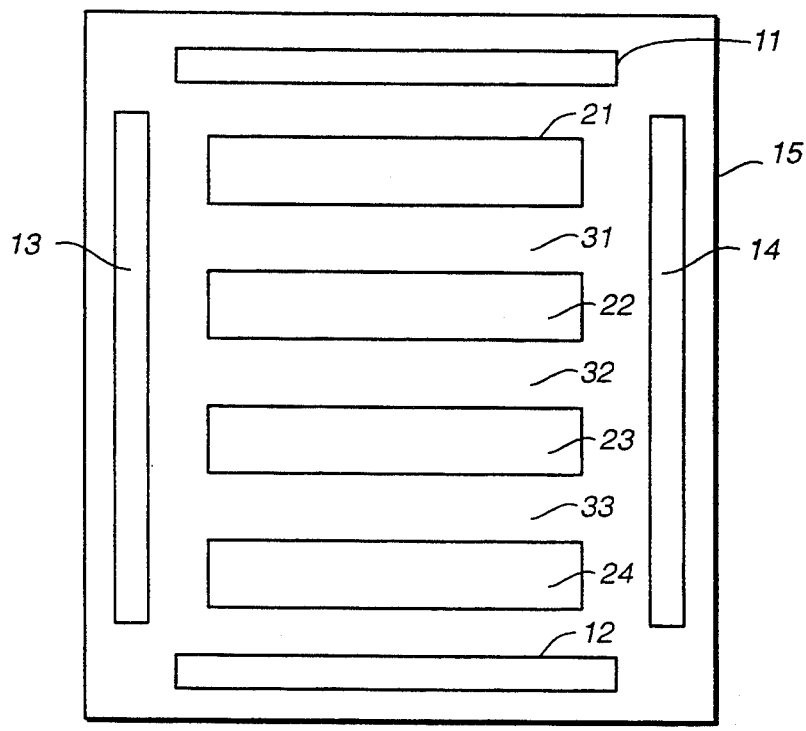
FIG._1
(PRIOR ART)
FIG._2B
(PRIOR ART)

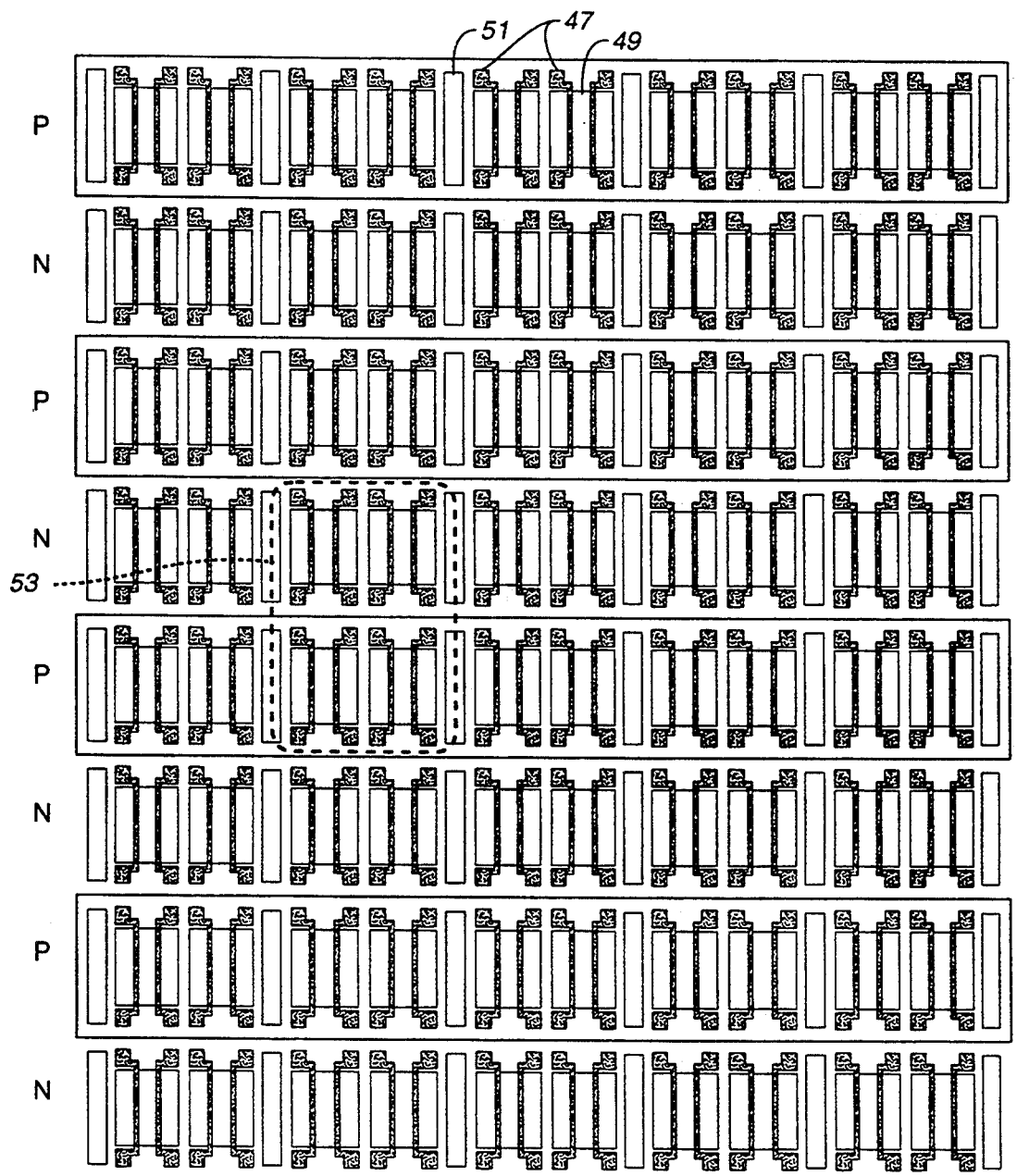
FIG._2A
(PRIOR ART)

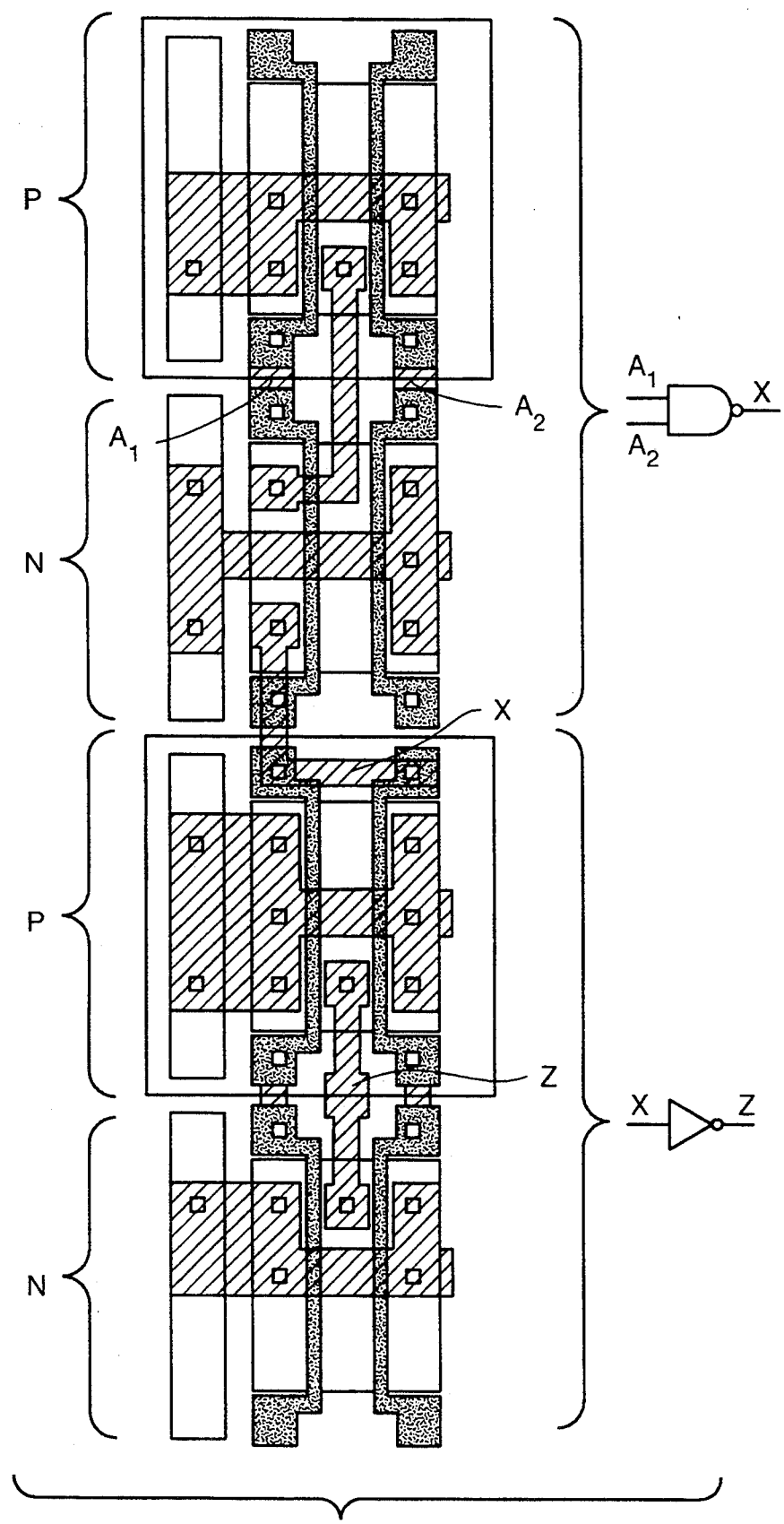
FIG._3

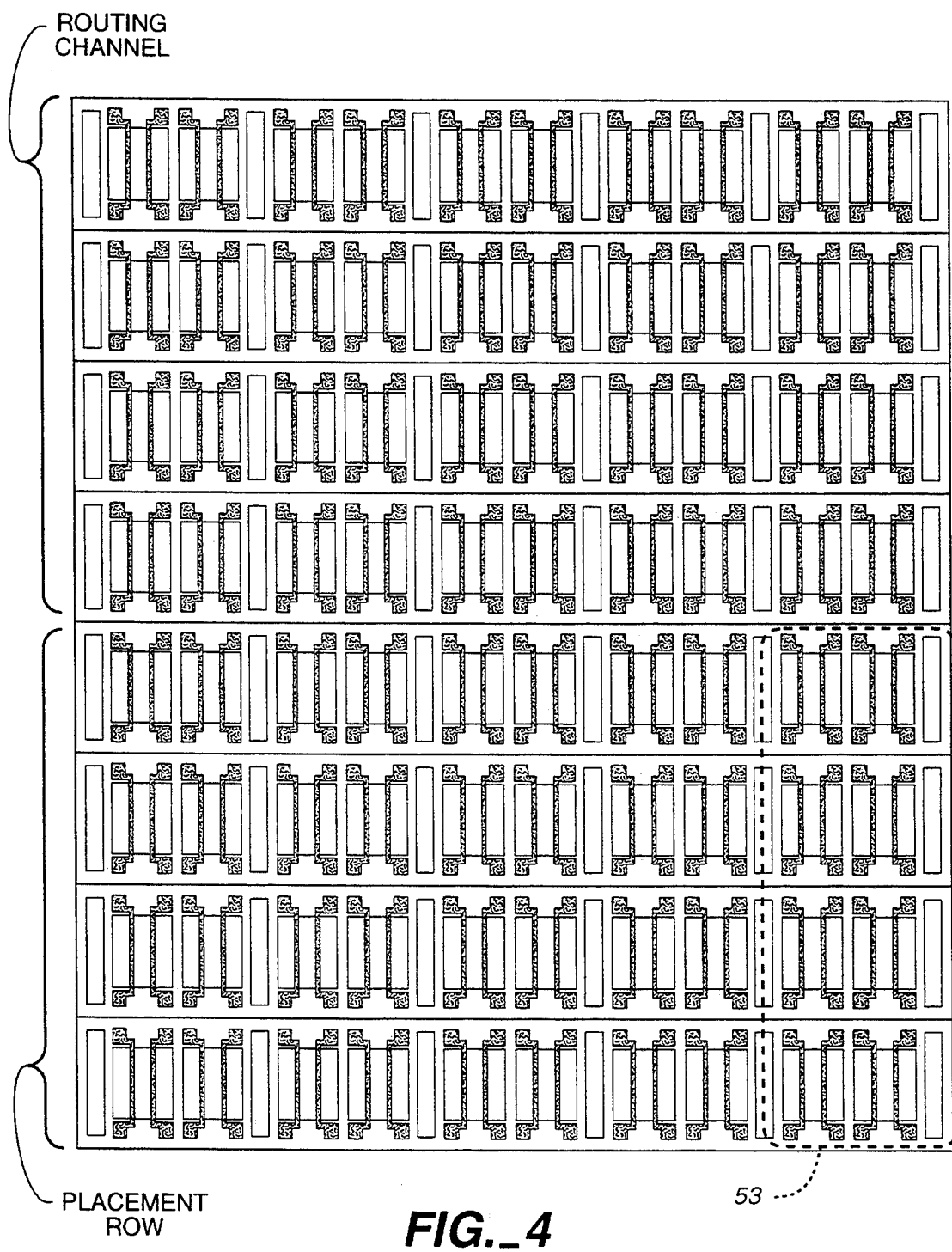
FIG._4

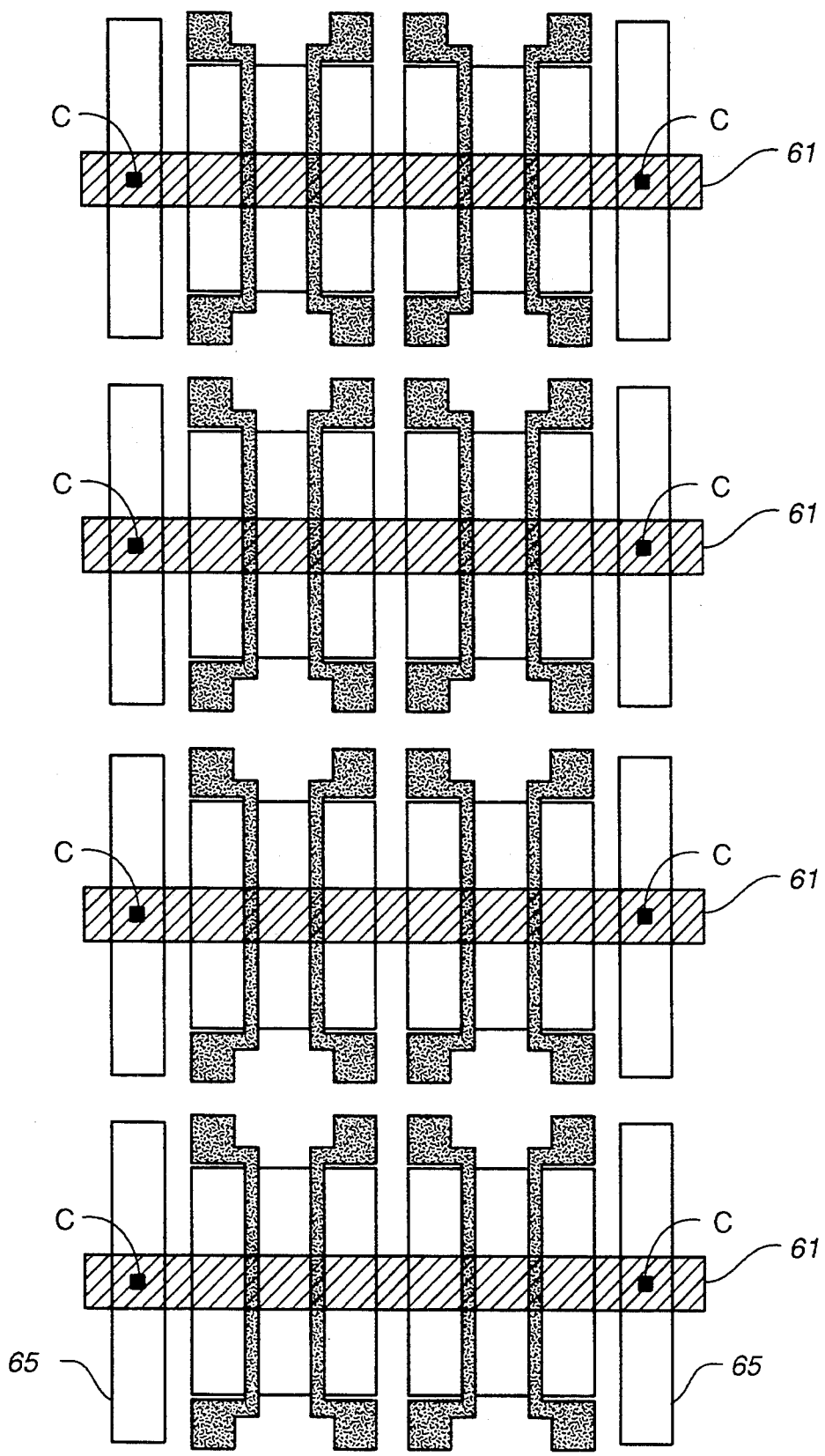
FIG._5
*(PRIOR ART)*

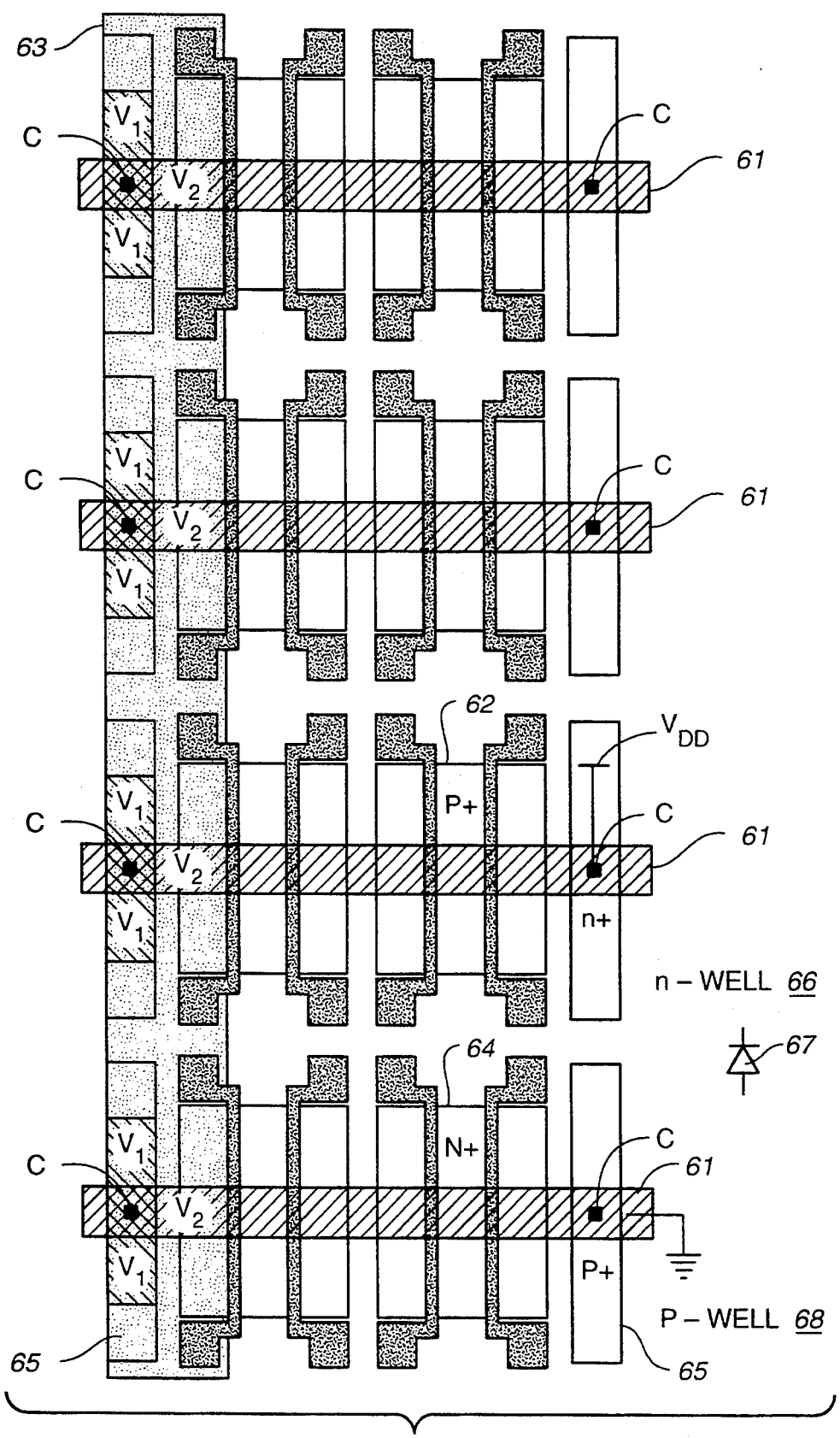
FIG._6
(PRIOR ART)

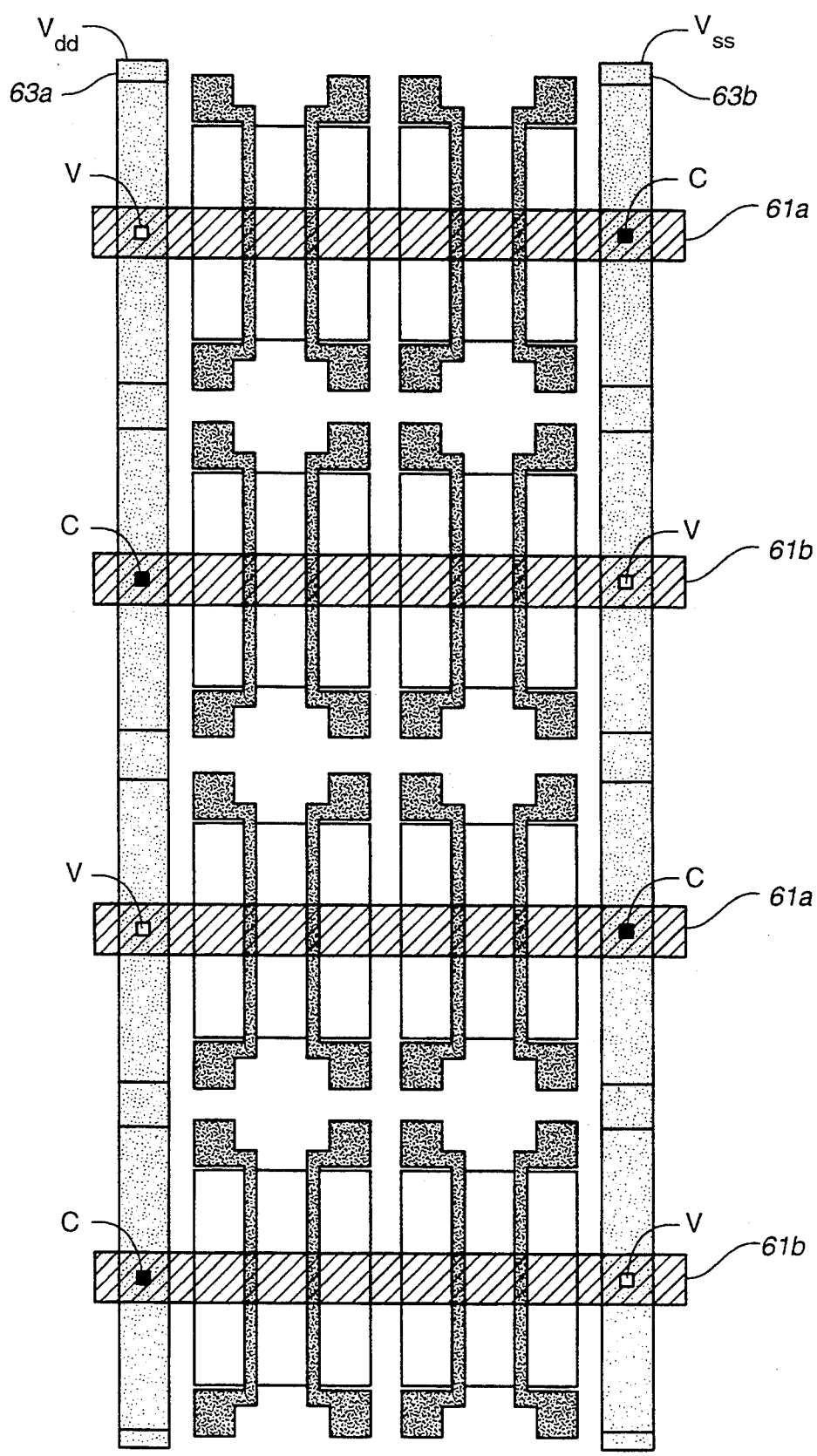
FIG._7

5,343,058

GATE ARRAY BASES WITH FLEXIBLE ROUTING

RELATED APPLICATION

The present application is a continuation-in-part of co-pending application Ser. No. 07/793,917 filed in the United States Patent and Trademark Office on Nov. 28, 1991, and commonly assigned herewith, the disclosure of which is incorporated herein in its entirety.

BACKGROUND OF THE INVENTION

1. Field of the Invention

The present invention generally relates to gate array circuits and, more particularly, the present invention relates to large semi-custom integrated circuits that have large gate arrays and large routing channels.

2. State of the art

It is well known to use standardized gate arrays to construct semi-custom integrated circuits. An example of a typical semiconductor integrated circuit or "chip" 15 based upon gate arrays is shown in FIG. 1 and is described in U.S. Pat. No. 4,562,453. In this example, the chip 15 has four peripheral blocks 11, 12, 13 and 14 that surround four internal functional gate regions 21, 22, 23 and 24. The spaces between the internal functional gate regions comprise routing channels or "tracks" 31, 32 and 33, for routing wires.

In a gate array chip of the type shown in FIG. 1, the peripheral blocks normally are used for input/output functions such as signal level conversion. In the internal functional gate regions, logic gates are regularly arrayed so that various circuits, herein referred to as "macro cells," can be constructed. The macro cells are interconnected by wiring that passes through the routing tracks 31, 32 and 33.

FIG. 2A shows a conventional layout of an internal functional gate region or "gate array base" of a gate array chip. More particularly, the drawing depicts a high-density CMOS gate array wherein rows of P-type transistors alternate with rows of N-type transistors. (In the following discussion, a P-type transistor row and an N-type transistor row are together referred to as a placement row.) The transistors are formed in pairs by extending polysilicon gate lines (e.g., line 47) across P-type or N-type diffusion regions (e.g., region 49). A macro cell might be placed, for instance, in the dark outlined region 53 of the gate array base. A typical macro cell is one placement row high and as many rows wide as necessary to realize its required function.

Further in the conventional layout gate array base shown in FIG. 2A, every "pair of pairs"—that is, every four transistors—is flanked on either side by a substrate connection region (e.g., 51).

FIG. 2B shows a typical example of an AND gate laid out in a macro cell according to the prior art, with the macro cell being a single placement row (i.e., two transistor rows) high. As indicated by the annotations to the drawing, the AND gate is realized from a two input NAND gate—having inputs A1 and A2, and output X—which is connected in series with an inverter to produce an output Z. That is, the left-hand side of the macro cell realizes the NAND gate function and the right-hand side realizes the inverter function.

In FIG. 2B, the solid shading represents polysilicon (e.g., region 37), the cross-hatching represents metal (e.g., region 39), and the large dotted-outline rectangular areas (e.g., region 41) represent diffusion regions. The diffusion regions in the upper half of the macro cell are of the P type, with polysilicon crossing twice above each diffusion region to form four P-type transistors. In the upper left-hand quadrant, the two P-type transistors are connected in parallel by the metal layer so that the transistors share a common output.

In the lower half of the macro cell in FIG. 2B, the diffusion regions are of the N-type with polysilicon crossing twice above each diffusion region to form four N-type transistors. More particularly, in the lower left-hand quadrant, two N-type transistors are connected in series with their output being taken to the right of the gate line farthest to the right. The gates of one of the P-type and one of the N-type transistors are joined together to form an input A1 and the gates of the other P-type and other N-type transistor are Joined together to form an input A2. The outputs of the parallel P-type combination and the series N-type combination are connected in common by metal to form the output X of the NAND gate.

As also shown in FIG. 2B, the macro cell includes contacts between metal and diffusion or polysilicon, represented by square outlines (e.g., region 40). The contacts between metal and a hidden metal layer are represented by a darkened square (e.g., region 43) located in substrate connected regions (e.g., region 45) between the basic cells.

When inputs A1 and A2 are both high during operation of the macro cell of FIG. 2B, the P-type transistors are both in the "off" state and the series-connected N-type transistors are both in the "on" state. This configuration results in a low voltage $V_{SS}$ being passed to the output of the second N-type transistor, thereby causing the output to go low. When either inputs A1 or A2 is low, at least one of the parallel-connected P-type transistors is "on," with the result that a high voltage $V_{DD}$ is passed through to the common output of the P-type transistors to cause the output to go high. At the same time, at least one of series-connected N-type transistors is off, with the result that the low voltage $V_{SS}$ is not passed through to the output.

On the inverter side of the macro cell of FIG. 2B, the output of the NAND gate is connected in common to each of the gates of the two P-type and two N-type transistors. When output X is at voltage $V_{SS}$, the P-type transistors are turned on and, as a result, the high voltage $V_{DD}$ is passed through to the output Z and the two N-type transistors are turned off. When output X is high at $V_{DD}$, the N-type transistors are turned on, with the result that the low voltage $V_{SS}$ is passed through to the output Z and the two P-type transistors are turned off.

One limitation of conventional gate arrays is that the routing area cannot be readily increased. One suggested way to this shortcoming is to run routing channels parallel to the transistors, thereby forming a column macro cell. This solution, however, constrains the macro cell sizes to be of fixed width and of a height that is a multiple of a large number of routing tracks (for example, eight). Thus, in this suggested solution, flexibility in routing channel size was gained at the expense of reduced flexibility in sizing macro cells.

Another suggested solution to the above-described shortcoming was to use field isolation (instead of gate isolation) and to separate P-type and N-type transistor gates. With the gates separated, a routing channel can be as small as either the N-type or P-type transistors. With the P-type and N-type gates connected according to the gate isolation technique, by contrast, a routing channel must be as high as the sum of the heights of the P-type and N-type transistors.

Even in field isolated designs, however, the commonly-used routing channel size has been approximately the same as the height of one P-type and N-type transistor. For large gate arrays, the resulting routing channel size is not large enough if the transistors are small. If the transistors are made larger, the routing channel size is less adjustable, since the minimum increment is the height of a P-type or N-type transistor. Large transistors also have larger gate capacitances, a disadvantage in many circuits.

A further problem encounted in the prior art is the obstruction of potential routing tracks by a known power grid arrangement shown in FIGS. 5 and 6. FIG. 5 shows a portion of the power grid formed in a first metalization layer (metal1), and FIG. 6 shows in addition the portion of the power grid formed in a second metalization layer (metal2). Referring first to FIG. 5, metal1 busses 61 are formed horizontally through the middle of each transistor row. The busses 61 cross the gate electrodes of all the transistors and also cross well-tie diffusion regions 65 formed at four transistor intervals along each transistor row. Conventionally, wherever one of the metal1 busses 61 crosses a well-tie diffusion region 65, a contact is formed between the bus and the diffusion region for purposes to be explained presently in connection with FIG. 6.

Referring now to FIG. 6, opposite types of transistors are formed in alternate transistor rows by for example forming P+ diffusion regions 62 in n- wells 66 to form P-type transistors and by forming N+ diffusion regions 64 in P- wells 68 to form N-type transistors. Where adjacent n- and P-wells adjoin, parasitic diodes 67 are formed that, if allowed to enter a conductive state, may cause circuit latch-up. Well-tie diffusion regions 65 are provided to ensure that the parasitic diodes 67 are always reverse biased. For example, in the n-wells 66, the well-tie region 65 are formed of n+ diffusion (to minimize voltage drop across the well-tie diffusion region) and tied to voltage $V_{DD}$ supplied by one of the metal1 busses 61. In the P-wells 68, well-tie regions 65 are formed of P+ diffusion and are tied to voltage $V_{SS}$ (ground) supplied by one of the metal1 busses 61. As a result, the parasitic diodes 67 are always reverse biased.

To complete the power grid, metal2 straps 63 are formed vertically and connected by vias to metal1 busses 61 supplying the same voltage. Complications arise, however, because vias and contacts are not allowed to occupy the same area on the chip (i.e., vias and contacts cannot be formed on top of one another). Moreover, what would otherwise be the preferred locations for vias connecting the metal2 straps 63 to the metal1 busses 61 are already occupied by contacts C connecting the metal1 busses 61 to the well-tie diffusions 65. As a result, in the prior art, vertical stubs have been extended from the metal1 busses 61 underlying the metal2 strap 63, so as to allow vias to be placed as necessary in the locations V1 spaced apart vertically from the contacts C. Also, the metal2 straps 63 have been made wider than (twice as wide as) the metal1 busses 61, allowing vias to be placed as necessary in the locations V2.

The disadvantage of such a technique is that routing tracks are obstructed. A grid of dots superimposed on the field of FIG. 6 (and also FIGS. 5 and 7) indicates potential routing tracks. If a via is placed at any of the locations V1, a potential horizontal routing track in the metal1 layer is obstructed. If a via is placed at any of the locations V2, a potential vertical routing track in the metal2 layer is obstructed. This situation limits the placement of macros that require use of these routing tracks.

SUMMARY OF THE INVENTION

According to the present invention, a transparent power grid is formed using a first metal layer and a second metal layer in a gate array having multiple transistor rows, each transistor row containing multiple transistors of a given type, alternate rows containing transistors of opposite types formed in wells of opposite-type diffusion, and the wells having defined therein well tie-down regions. The first metal layer includes first power supply busses for supplying operating and reference voltages to the transistors, the first power supply busses extending in a row direction and at least partially overlapping the well tie-down region. The second metal layer includes second power supply busses for supplying operating and reference voltages to the transistors, the second power supply busses extending in a column direction and at least partially overlapping the well tie-down regions and the first power supply busses. Vias are formed where first and second power supply busses each supplying a same one of the operating voltage and the reference voltage overlap, thereby connecting the first and second power supply busses. Contacts are formed where first and second power supply busses each supplying a different one of the operating voltage and the reference voltage overlap, the contacts connecting the first power supply busses to underlying well tie-down regions. In effect, all of the necessary vias and contacts are placed in locations that in the prior art were all occupied by contacts alone.

BRIEF DESCRIPTION OF THE DRAWINGS

The present invention can be further understood with reference to the following description in conjunction with the appended drawings, wherein like elements are provided with the same reference numerals. In the drawings:

FIG. 1 is a plan view of a gate array chip according to the prior art.

FIG. 2A is a plan view of a gate array base according to the prior art;

FIG. 2B is a plan view of a macro cell according to the prior art;

FIG. 3 is a plan view of an AND gate macro cell according to the present invention;

FIG. 4 is a plan view of the gate array base according to the present invention showing a typical arrangement of a placement row and a routing channel;

FIG. 5 is a plan view of part of the gate array base of FIG. 2A showing power busses formed conventionally in a first metallization layer and contacts between the power busses and well tie-down regions.

FIG. 6 is a plan view showing in addition to the features of FIG. 5 a power strap formed conventionally in a second metallization layer and via sites for connecting the power strap to the power busses; and FIG. 7 is a plan view of part of the gate array base of FIG. 4 showing features corresponding to those of FIG. 6 but with vias and contacts placed so as to not interfere with routing, in accordance with the present invention.

DESCRIPTION OF THE PREFERRED EMBODIMENTS

FIG. 3 shows tall macro cells created from small transistors to realize the AND function by providing a placement row that is four transistor rows high as compared to the two transistor rows of FIG. 2B. Also, the transistor rows in FIG. 3 are only half as high as the transistor rows of FIG. 2B, with the result that the overall height of the placement row is the same.

Using current technology, the transistor rows of FIGS. 2B and 3 can be each sixteen microns high (five routing tracks at a routing pitch of 3.2 microns).

By using macro cells such as shown in FIG. 3 and by alternating routing channels and cell placement rows as shown in FIG. 4, large routing channels (e.g., twenty routing tracks high) can be achieved without routing over more than fifty-percent of the transistors. If instead macro cells were designed using only two small transistor rows, for example, a routing channel of more than ten tracks would require more than two rows, with the result that more than half the area of the combined area of the macro cell and the routing channel would be dedicated to the routing channel.

In practice, not every routing channel on a gate array need be the same size. Using macro cells such as shown in FIG. 3, for instance, the size of the routing channel can be increased in increments of five routing tracks (which is the size of a transistor row). Routing channels may therefore be of a size "5n" routing tracks where "n" is an integer including 0, resulting in considerable routing flexibility.

Many types of circuits are better implemented using small transistors as in the macro cell of FIG. 3. For example, speed improvements can be achieved by, wherever practicable, having the inputs of the macro cell drive only a single small transistor pair while the outputs of the macro cell drive more than one small transistor pair. Thus, the drive capability of a macro cell can be increased without increasing its input load. In FIG. 3, for example, each of the inputs A1 and A2 are used to drive one P-type and one N-type transistor whereas the output Z is driven by two P-type and two N-type transistors.

In the gate array base in FIG. 4, using macro cells four transistor rows high as exemplified by the macro cell of FIG. 3, alternate placement rows may be used for cell placement and routing, respectively, as in the prior art, but the resulting routing channel is now twenty routing tracks high, sufficient for routing of large, dense gate arrays. Routing channels nevertheless do not occupy more than 50% of the gate array base. Furthermore, if a routing channel more or less than twenty routing tracks high is needed, the routing channel may be easily increased in increments of five routing tracks. Also, because the transistors are made small, versatility is achieved since small transistors are available for circuits requiring them and small transistors may be interconnected as necessary to form large transistors to create large drive macro cells wherever necessary.

Routing flexibility may be further enhanced using a transparent gate array power grid that does not obstruct potential routing tracks as in FIG. 6, previously described. Referring to FIG. 7, the horizontal metal1 busses 61 alternately supply $V_{DD}$ (busses 61a) and $V_{SS}$ (busses 61b). The vertical metal2 straps, in contrast to the prior art, are only one routing track wide. The vertical metal2 straps 63 also alternately supply $V_{DD}$ (strap 63a) and $V_{SS}$ (strap 63b). Therefore, whether traversing a metal1 bus or a metal2 strap, power lines of the same type intersect only every other intersection. Where a bus 61 and a strap 63 of the same type intersect at locations V, vias are placed connecting the busses and the straps. Where busses and straps of different types intersect at locations C, contacts are placed connecting the metal1 busses to the underlying well tie-down regions. The intersections between the metal1 busses and the metal2 straps are occupied alternately by vias and contacts. Successive contacts between the metal1 busses and the well tie-down regions are located no more than four transistor columns (14 routing tracks) apart, twice as far apart as in the prior art but sufficiently close to prevent latch-up using a preferred technology (0.8 $\mu$ CMOS).

Furthermore, contacts may be placed more frequently as circumstances allow. Rather than the placement of contacts being predetermined in connection with layout of the gate array base or in connection with layout of the macros themselves, placement of the contacts is determined at a later design stage in connection with layout of the power grid. When a routing track vertically adjacent the location of a via between a metal1 bus and a metal2 strap remains unoccupied, an additional contact is placed in the vertically adjacent position, a vertical stub being extended from the metal1 bus to allow for placement of the contact, such that the location that would have been occupied in the prior art by a via is replaced by a contact between the metal1 bus and the underlying well-tie down region.

Metal2 straps need not be placed over all of the well tie-down regions. Rather, the metal2 straps may be used only as required. Additional contact/via locations, instead of being occupied by vias, are thereby freed up for the placement of contacts between the metal1 busses and the well tie-down regions.

The foregoing has described the principles, preferred embodiments and modes of operation of the present invention. However, the invention should not be construed as limited to the particular embodiments discussed. Instead, the above-described embodiments should be regarded as illustrative rather than restrictive, and it should be appreciated that variations may be made in those embodiments by workers skilled in the art without departing from the scope of present invention as defined by the following claims.

What is claimed is:

1. A circuit comprising:
   a gate array base having multiple transistor rows, each transistor row containing multiple transistors of a given type, alternate rows containing transistors of opposite types formed in wells of opposite-type diffusion, said wells having defined therein well tie-down regions;
   a first metal layer including first power supply busses for supplying operating and reference voltages to said transistors, said first power supply busses extending in a row direction and at least partially overlapping said well tie-down regions;
   a second metal layer including second power supply busses for supplying operating and reference voltages to said transistors, said second power supply busses extending a column direction and at least partially overlapping said well tie-down regions and said first power supply busses;

vias connecting said first and second power supply busses each supplying a same one of said operating voltage and said reference voltage; and contacts connecting ones of said first power supply busses and ones of said well tie-down regions;

of said vias and contacts, only said vias being formed where first and second power supply busses each supplying a same one of said operating voltage and said reference voltage overlap and only said contacts being formed where first and second power supply busses each supplying a different one of said operating voltage and said reference voltage overlap.

2. The apparatus of claim 1 wherein first power supply busses for supplying said operating voltage and first power supply busses for supplying said reference voltage are alternated.

3. The apparatus of claim 2 wherein second power supply busses for supplying said operating voltage and second power supply busses for supplying said reference voltage are alternated.

4. The apparatus of claim 2 wherein one of said first power supply busses and said second power supply busses overlap said well tie-down regions substantially entirely.

5. The apparatus of claim 3 wherein one of said first and second power supply busses are of a width substantially equal to a width of said well tie-down regions.

6. The apparatus of claim 3 wherein one of said first and second power supply busses are of a width substantially equal to a width of an area between groups of transistor pairs in a row direction.

7. The apparatus of claim 1 wherein each of said vias is separated form a closest one of said contacts a distance not substantially less than a height of one of said transistor rows.

* * * * *